US 7,746,181 B1

(12) United States Patent
Moyal (10) Patent No.: US 7,746,181 B1
(45) Date of Patent: Jun. 29, 2010

(54) CIRCUIT AND METHOD FOR EXTENDING THE USABLE FREQUENCY RANGE OF A PHASE LOCKED LOOP (PLL)

(75) Inventor: Nathan Moyal, West Linn, OR (US)

(73) Assignee: Cypress Semiconductor Corporation, San Jose, CA (US)

( * ) Notice: Subject to any disclaimer, the term of this patent is extended or adjusted under 35 U.S.C. 154(b) by 169 days.

(21) Appl. No.: 11/329,787

(22) Filed: Jan. 10, 2006

Related U.S. Application Data

(60) Provisional application No. 60/648,326, filed on Jan. 28, 2005.

(51) Int. Cl.
*H03L 7/181* (2006.01)
*G01R 23/15* (2006.01)

(52) U.S. Cl. .............................. 331/44; 331/11; 331/16
(58) Field of Classification Search .................. 331/11, 331/14, 16, 44
See application file for complete search history.

(56) References Cited

U.S. PATENT DOCUMENTS

| | | | |
|---|---|---|---|
| 5,389,898 | A | 2/1995 | Taketoshi et al. |
| 5,648,744 | A | 7/1997 | Prakash et al. |
| 5,686,864 | A | 11/1997 | Martin et al. |
| 5,777,520 | A | 7/1998 | Kawakami |
| 5,933,058 | A * | 8/1999 | Pinto et al. ..................... 331/17 |
| 6,583,675 | B2 | 6/2003 | Gomez |
| 6,993,314 | B2 * | 1/2006 | Lim et al. .................... 455/333 |
| 7,099,643 | B2 * | 8/2006 | Lin ............................. 455/255 |
| 7,109,763 | B1 | 9/2006 | Moyal et al. |
| 7,432,749 | B1 * | 10/2008 | Gehring et al. ............. 327/156 |

OTHER PUBLICATIONS

Lee et al., "A Sigma-Delta Fractional-N Frequency Synthesizer Using a Wide-Band Integrated VCO and a Fast AFC Technique for GSM/GPRS/WCDMA Applications," IEEE Journal of Solid-State Circuits, vol. 39, No. 7, Jul. 2004, pp. 1164-1169.
"Phase-Locked Loops' Design, Simulation, and Applications," Roland E Best, 5th Edition, Copyright 2003 by the McGraw-Hill Companies, Inc., ISBN 0-07-141201-8; pp. vii-ix/1-6/93-102; 21 pages Book —2003.
USPTO Notice of Allowance for U.S. Appl. No. 10/796,873 dated Feb. 13, 2006; 6 pages.
USPTO Advisory Action for U.S. Appl. No. 10/796,873 dated Oct. 13, 2005; 3 pages.
USPTO Final Rejection for U.S. Appl. No. 10/796,873 dated Sep. 6, 2005; 7 pages.
USPTO Non-Final Rejection for U.S. Appl. No. 10/796,873 dated May 18, 2005; 9 pages.
U.S. Appl. No. 10/796,873: "Phase Locked Loop Operable Over a Wide Frequency Range," Moyal et al.; 28 pages Mar. 8, 2004.

* cited by examiner

*Primary Examiner*—Robert Pascal
*Assistant Examiner*—James E Goodley

(57) ABSTRACT

An improved circuit and method is described herein for extending the usable frequency range of a high performance, narrow band phase locked loop (PLL) device. For example, the improved circuit and method may perform a calibration sequence for calibrating an LC-type voltage controlled oscillator (VCO) immediately before or during operation of the PLL device. Unlike previous methods, the calibration sequence described herein provides a fast and convenient method for extending the usable frequency range of a PLL by shifting the center frequency of the LC-type VCO to a desired frequency. For example, the VCO center frequency may be incrementally shifted (e.g., either high or low) to compensate for the actual environmental conditions in which the PLL is used (i.e., to compensate for specific process, voltage, and temperature conditions). Once the calibration bits are set to the desired frequency, the calibration sequence is disabled, and the appropriate calibration bit values are applied to the VCO during normal operation of the PLL.

16 Claims, 5 Drawing Sheets

CIRCUIT AND METHOD FOR EXTENDING THE USABLE FREQUENCY RANGE OF A PHASE LOCKED LOOP (PLL)

PRIORITY CLAIM

This application claims benefit to provisional application No. 60/648,326 entitled "Method of Oscillator Calibration using Frequency Locked Loop," filed Jan. 28, 2005 and incorporated herein in its entirety.

BACKGROUND OF THE INVENTION

1. Field of the Invention

This invention relates to electronic circuits and, more particularly, to clock generation and timing circuits.

2. Description of the Related Art

The following descriptions and examples are given as background only.

Phase locked loops (PLLs) are commonly used for data and telecommunications, frequency synthesis, clock recovery, and similar applications. In some cases, a PLL may be used in the I/O interfaces of digital integrated circuits to hide clock distribution delays and to improve overall system timing. In other cases, a PLL may be used as a clock multiplier for downstream circuit components. In one example application, an input clock of 10 Mhz can be multiplied by the PLL to yield a 1000 Mhz output signal, which may then be used for clocking internal circuit components. Ideally, this input (or source) clock multiplication could result in an output that is in perfect phase alignment with the input clock. However, in practice this is often not the case.

Figure 1:
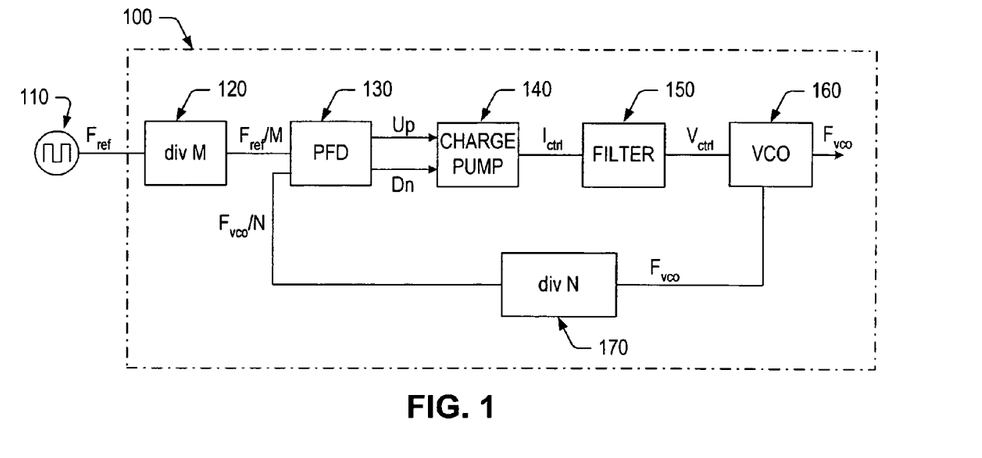
FIG. 1 is a block diagram illustrating one example of a conventional phase lock loop (PLL)

A typical PLL device 100 is shown in FIG. 1 as including an optional reference divider (div M) 120, a phase frequency detector (PFD) 130, a charge pump 140, a low pass filter 150, a voltage controlled oscillator (VCO) 160, and an optional frequency divider (div N) 170.

During operation, PLL circuit 100 receives a reference clock signal ($F_{REF}$) from an external source (e.g., a crystal oscillator) 110. The phase frequency detector compares the reference signal ($F_{REF}$) to a feedback signal ($F_{VCO}$) generated by components within the PLL circuit. More specifically, PFD 130 detects differences in frequency and/or phase between the reference and feedback clock signals, and generates compensating "up" and "down" signals in response thereto. The particular control signals generated depend on whether the feedback clock signal is lagging or leading the reference clock signal in frequency or phase. The up/down control signals are passed through charge pump 140 and filter 150 to integrate the control signals into a control voltage, which is sent to the VCO. The voltage-controlled oscillator converts the voltage information into one or more output frequencies ($F_{VCO}$). One of these output frequencies may then be sent back to the PFD via a feedback loop.

In some cases, frequency divider 170 and reference divider 120 may be included for adjusting the frequencies of the feedback and reference clock signals, respectively. For example, frequency divider 170 may be used for dividing the frequency of a VCO output signal ($F_{OUT}$) to produce a divided down feedback signal ($F_{OUT}/N$), while reference divider 120 is used for dividing the frequency of the external clocking signal to produce a divided down reference signal ($F_{REF}/M$), which is similar or dissimilar to the divided down feedback signal. In such cases, PLL 100 may function as a clock or frequency multiplier. However, dividers 120 and/or 170 may not be included in all cases.

In conventional PLL devices, high-performance inductor-capacitor (LC) VCOs are often used to create low-noise, high-speed PLLs. For example, LC-type oscillators are often used in PLL designs tailored for wireless and low power applications, as well as other applications requiring precise timing. Unfortunately, LC-type oscillators have a tight frequency range, which is sensitive to variations in process, voltage and temperature (PVT). In some cases, variations in PVT may cause the VCO frequency range to shift outside of a target range, thereby limiting the usable frequency range of the PLL device. For this reason, various solutions have been proposed for extending the usable frequency range of a PLL device employing an LC-type oscillator.

One solution to the above-mentioned problem is to create or use a VCO with a wide frequency range. For example, a wider frequency range can be obtained by increasing the gain of an LC-type oscillator, or by using a completely different oscillator (e.g., a ring oscillator) with an inherently wider frequency range. Unfortunately, large VCO gains are undesirable because of their sensitivity to noise. In addition, although a wide frequency range may be easily obtained when the ring oscillator is employed as a VCO, the ring oscillator is not without limitations and usually demonstrates poorer phase-noise performance than the LC-type oscillator.

Another solution is to use multiple LC-type oscillators within the PLL device. For example, a first VCO may be used for generating frequencies within a 2-2.45 GHz range, while a second VCO is used for generating frequencies within a 2.45-2.5 Ghz range. Additional or alternative VCOs may be used for generating frequencies within other ranges. Unfortunately, the second solution may be undesirable in many applications, due to the relatively large die area consumed by the additional VCO(s).

In yet another solution, an LC-type VCO may be calibrated during the manufacturing test process to shift the VCO operating frequency into a desired range. For example, test circuitry may be used for measuring the max VCO frequency, measuring the min VCO frequency and calculating an average of the two. The test circuitry may then be used for adjusting the programmable bits supplied the LC-type VCO until the measured value(s) equal a set of target value(s). Unfortunately, the third conventional solution is too slow (i.e., adds additional test time) and does not compensate for the environmental conditions that the device will actually be used in (i.e., the method does not account for power supply and temperature variations, only for process variations).

In yet another solution, an LC-type VCO may be calibrated during operation of the PLL device to shift the VCO operating frequency into a desired range. One such solution is described in a paper entitled "A Delta-Sigma Fractional-N Synthesizer using a Wide-Band Integrated VCO and a Fast AFC Technique for GSM/GPRS/WCDMA Applications," and published in the July 2004 issue of IEEE Journal of Solid-State Circuits (JSSCC), vol. 39, no. 7, pgs. 1164-1169. In this solution, a pair of switches are used for disconnecting the low pass filter from the VCO (i.e., opening the loop) to enter a VCO calibration mode. To achieve calibration, digital frequency counters are used for counting the number of reference and feedback clock pulses supplied thereto. A comparator is then used to determine the proper VCO frequency by comparing the number of feedback pulses to the number of reference pulses, while a state machine is used for adjusting the programmable bits supplied to the VCO. Unfortunately, the frequency counters and state machine used in the fourth solution are too slow for many high-speed applications (e.g., it may take about 650 clock cycles to complete the calibration using the method describe above). In addition, the switches used for disconnecting the low pass filter from the VCO introduce a series resistance into the PLL signal path. This is undesirable because it tends to alter the behavior of the filter.

Therefore, a need remains for an improved calibration solution that may be used for extending the usable frequency range of a PLL device. Preferably, the improved solution would allow frequency calibration and compensation of a narrow band PLL over a wide range of actual environmental conditions, including process, voltage, and temperature. Even more preferably, the improved solution would provide a circuit and method for calibrating an LC-type oscillator during operation of a PLL device, wherein said calibration is performed without opening the loop and with much greater speed than possible with conventional solutions.

SUMMARY OF THE INVENTION

The following description of various embodiments of circuits and methods is not to be construed in any way as limiting the subject matter of the appended claims.

According to one embodiment, a circuit is provided herein for calibrating an oscillator included within a phase locked loop (PLL) device. In one example, the circuit may include a calibrate enable signal, an analog comparison block, a digital control block and a calibrate enable control block. When supplied to the PLL, the calibrate enable signal may cause the PLL to enter a calibration mode without disconnecting the oscillator (e.g., an LC-type VCO) from other PLL components. This enables a calibration sequence to be performed without adding a series resistance to the signal path of the PLL.

In some cases, the analog comparison block may be coupled for receiving a reference clock signal and a feedback clock signal from the PLL when the PLL is operating in the calibration mode. In one example, the analog comparison block may include a pair of frequency-to-voltage (F-to-V) converters and an operational amplifier.

In some cases, the F-to-V converters may be coupled for converting the reference and feedback clock signals into a pair of corresponding voltages. The operational amplifier may then be used for comparing the pair of voltages to determine whether an operating frequency of the oscillator should be increased or decreased.

In some cases, the digital control block may be coupled for supplying a calibration signal to the oscillator based on the determination made by the analog comparison block. In one example, the digital control block may include an up/down counter and additional logic. In some cases, the calibration signal generated by the digital control block may include a number of calibration bits, which may be used for increasing or decreasing the operating frequency of the oscillator by a fixed or programmable amount. For example, the calibration bits may be used to alter a center frequency of the oscillator by connecting or disconnecting one or more capacitors included within a switched capacitor bank of an LC-type voltage controlled oscillator (VCO).

In some cases, the calibrate enable control block may be coupled for receiving the calibrate enable signal and a clocking signal having a preset number of cycles. In addition, the calibrate enable control block may be configured for clocking the digital control block once for every cycle of the clocking signal and for disabling the digital control block thereafter. For example, the clocking signal may be derived from the reference clock signal, the feedback clock signal or a user defined clock signal (having, e.g., a higher or lower frequency than the reference and feedback clock signals). In some cases, the preset number of cycles used for clocking the digital control block may be based on a simulated number of cycles needed for calibrating the oscillator within a target frequency range. Once the predetermined number of cycles has been reached, the calibration circuitry is disabled and the PLL circuitry is run in a normal operation mode with the VCO control line tied to the new calibration frequency.

According to another embodiment, a method is provided herein for extending a usable frequency range of a phase locked loop (PLL) device. In one example, the method may include (i) programming an oscillator of the PLL to a desired operating frequency, (ii) running the PLL in a calibration mode without disconnecting the oscillator from other PLL components, and (iii) extending the usable frequency range of the PLL by adjusting the operating frequency of the oscillator in the calibration mode to account for variations in process, voltage and temperature conditions occurring during operation of the PLL.

In some cases, the step of running the PLL in the calibration mode may be performed by supplying a calibrate enable signal to one or more PLL components. In one example, the calibrate enable signal may be used to tri-state a phase frequency detector (PFD) of the PLL and force the oscillator into a voltage state corresponding to the desired operating frequency. This is highly beneficial because it enables the calibration sequence to be performed without adding a series resistance to the signal path of the PLL.

In some cases, the step of adjusting the operating frequency of the oscillator may be performed by (i) receiving reference and feedback clock signals from the PLL, (ii) converting the reference and feedback clock signals into a corresponding pair of voltages, and (iii) comparing the pair of voltages against one another to determine whether the operating frequency of the oscillator should be adjusted by an incremental positive or negative amount. In some cases, the method may disable the calibration mode and return the PLL to the normal operation mode once the adjustments made to the operating frequency begin to toggle between incremental positive and negative amounts. In other cases, the calibration mode may be run in parallel with a normal operation mode of the PLL.

According to yet another embodiment, a phase locked loop (PLL) device is provided herein. In one example, the PLL device may include a phase frequency detector (PFD), a voltage controlled oscillator (VCO) and a calibration block. The PFD may be coupled for receiving a reference clock signal from an external source and a feedback clock signal from the VCO. The calibration block may be coupled to the PFD and the VCO for calibrating the VCO. For example, the calibration block may be configured for: (i) receiving the reference and feedback clock signals during a calibration mode of the PLL, (ii) converting the reference and feedback clock signals into a pair of corresponding voltages, (iii) comparing the pair of voltages to determine whether an operating frequency of the VCO should be increased or decreased, and (iv) supplying a calibration signal to adjust the operating frequency of the VCO based on said comparison.

BRIEF DESCRIPTION OF THE DRAWINGS

Other objects and advantages of the invention will become apparent upon reading the following detailed description and upon reference to the accompanying drawings in which.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF PREFERRED EMBODIMENTS

An improved circuit and method is described herein for calibrating and compensating the frequency range of a narrow band PLL over process, voltage, and temperature (PVT). As described in more detail below, the improved circuit and method may perform a calibration sequence immediately before or during operation of the PLL device for adjusting the number and/or polarity of the calibration bits supplied to a voltage controlled oscillator (VCO). In a preferred embodiment, the improved circuit and method described herein may be used for calibrating an LC-type VCO. However, the inventive concepts described herein are not limited to an LC-type VCO and may be applied to other types of oscillators with relatively little modification.

The calibration sequence described herein provides a fast and convenient method for extending the usable frequency range of a PLL by shifting the center frequency of the LC-type VCO to a desired frequency. For example, the center frequency and range of the VCO may be incrementally shifted (e.g., either high or low) to compensate for the actual environmental conditions in which the PLL is used (i.e., to compensate for a specific process, voltage, and temperature conditions). Once the calibration bits are set to the desired frequency, the calibration sequence is disabled, and the appropriate calibration bit values are applied to the VCO during normal operation of the PLL.

Figure 2:
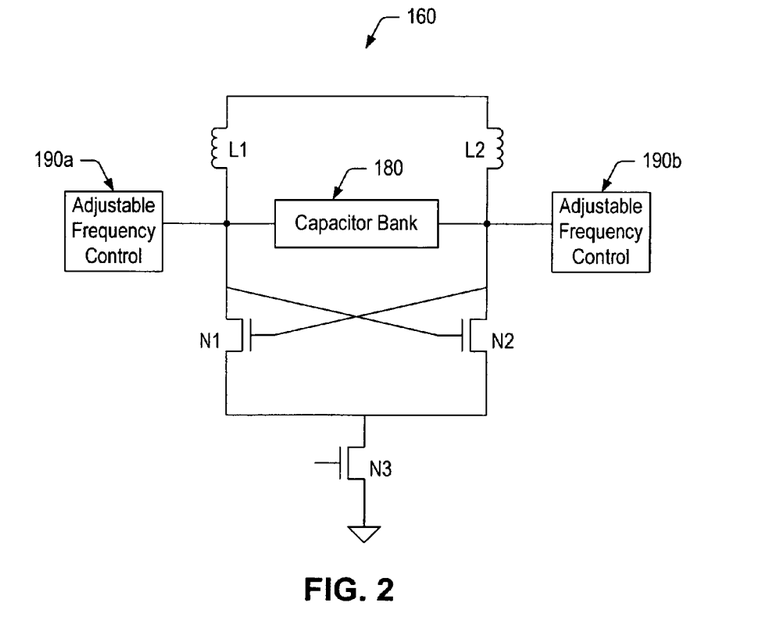
FIG. 2 is a simplified circuit diagram illustrating one example of an LC-type voltage controlled oscillator (VCO) that may be used within the PLL of FIG. 1.

FIG. 2 illustrates one example of an LC-type oscillator 160 that may be included within a PLL device (such as PLL 100). In the embodiment of FIG. 2, oscillator 160 is implemented as a CMOS LC-tank oscillator with on-chip spiral inductors (L1, L2), cross-coupled transistors (N1, N2) and current source (N3). In addition to other circuit elements, oscillator 160 includes a switched capacitor bank 180 for adjusting the center frequency of the oscillator and a pair of frequency control modules 190a, 190b for controlling the adjustment. In one example, switched capacitor bank 180 may include a number of capacitors (or binary-weighted NMOS switches) for course adjustment and a pair of p-n varactor diodes for fine adjustment. In one example, the pair of frequency control modules 190a, 190b may include a pair of adjustable capacitors.

It is noted that FIG. 2 illustrates only one embodiment of an LC-type oscillator. Other embodiments with additional or alternative circuit elements may be employed for purposes of this invention. Regardless of the particular embodiment used, the center frequency ($fc \approx \sqrt{LC}$) of the LC-type oscillator may be adjusted by adding/removing capacitance to/from the switched capacitor bank 180. In other words, the center frequency and range of an LC-type VCO is determined by the values of the inductor/capacitance (LC) network. Since it is not generally feasible to alter the inductance, the capacitance of the network can be adjusted by activating one or more capacitors within an array of capacitors. For example, the VCO center frequency can be altered by using one or more calibration bits to program more or less capacitance. This alters the VCO frequency.

CMOS LC-tank oscillators with on-chip spiral inductors and switched capacitor banks have been used in the past to improve the phase-noise performance of PLLs. Although CMOS LC-tank oscillators tend to provide better noise performance, CMOS LC-tank oscillators must overcome several barriers before becoming a reliable VCO. In particular, the implementation of a high-quality inductor in a standard CMOS process is often limited by parasitic effects and usually requires extra non-standard processing steps. In addition, LC-tank oscillators usually demonstrate a narrow frequency range, which is sensitive to variations in process, voltage and temperature. The present invention addresses the latter concern by providing an improved circuit and method for calibrating the oscillator "on-the-fly" (i.e., during operation of the PLL device). The calibration sequence described herein enables a user to compensate for variations in PVT by shifting the narrow frequency range of the oscillator into a target frequency range.

Figure 3:
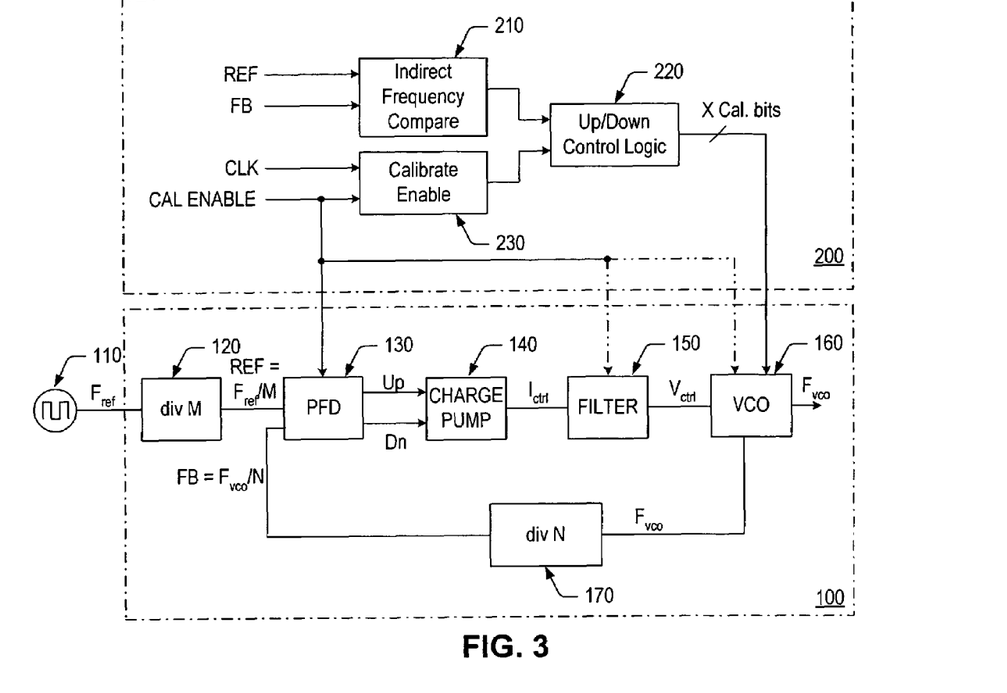
FIG. 3 is a block diagram illustrating one embodiment of an improved PLL calibration solution in accordance with the present invention.

FIG. 3 illustrates one embodiment of an improved circuit 200 that may be used for calibrating an LC-type oscillator, in accordance with the present invention. In the general embodiment shown in FIG. 3, calibration circuit 200 includes an analog comparison block ("frequency compare") 210, a digital control block ("up/down control logic") 220 and a calibrate enable block 230. In some cases, the calibration circuit 200 may be implemented on the same chip as PLL 100, or alternatively, as an off-chip component.

As shown in FIG. 3, analog comparison block 210 may be coupled for receiving a reference clock signal (REF) and a feedback clock signal (FB) from a PLL device (e.g., PLL 100) when the PLL device is operating in a calibration mode. As described in more detail below, the analog comparison block functions to convert the REF and FB clock signals into a pair of voltages. The analog comparison block then compares the pair of voltages to determine whether the VCO center frequency should be increased or decreased by an incremental (and sometimes, programmable) amount. Once the determination is made, digital control block 220 is used for supplying a calibration signal ("X Cal. Bits") to the VCO based on the determination made by the analog comparison block.

Calibrate enable block 230 is coupled for receiving a calibrate enable signal (CAL ENABLE). As shown in FIG. 3, the CAL ENABLE signal may be supplied to one or more PLL components (e.g., PFD 130, filter 150 and/or VCO 160) for entering a calibration mode. For example, the CAL ENABLE signal may be supplied to filter 150 or VCO 160 for setting a control voltage of the VCO to a value corresponding to a desired operating frequency. In addition, the CAL ENABLE signal may be supplied to PFD 130 for tri-stating the PFD and disabling charge pump 140. Tri-stating the PFD allows the PLL device to enter the calibration mode without disconnecting the VCO from other PLL components. In other words, calibration block 200 improves upon conventional solutions by allowing the PLL to enter a calibration mode without introducing a series resistance (e.g., series switches) within the signal path of the PLL or disconnecting the filter from the VCO.

Calibrate enable block 230 is also coupled for receiving a clocking signal (CLK). In some embodiments, the CLK signal may be selected from a number of available clocking signals including, but not limited to, the external clock frequency ($F_{REF}$), the divided-down reference frequency ($F_{REF}/M$), the VCO output frequency ($F_{VCO}$) and the divided-down feedback frequency ($F_{VCO}/N$). In other embodiments, the CLK signal may be a user defined clock signal obtained from an external source (e.g., a crystal oscillator) or derived from an internal source (e.g., derived from the reference or feedback clock signals). In one example, the user defined clock signal may be configured with a relatively higher or lower frequency than the reference and feedback clock signals. If a higher clock frequency is selected, the user defined clock signal may be used to reduce the amount of time needed for calibrating the oscillator and achieving PLL phase-lock.

Figure 4:
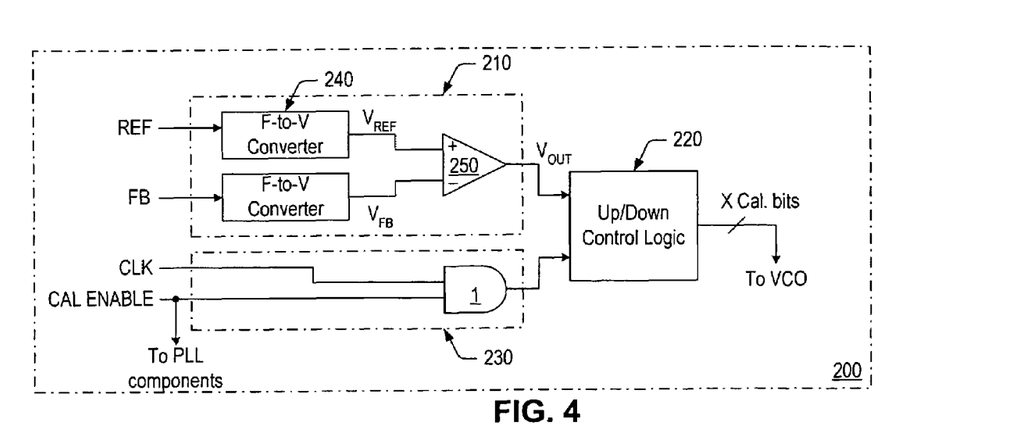
FIG. 4 is a detailed view of the improved PLL calibration solution shown in FIG. 3, according to one embodiment of the invention.

Regardless of the particular CLK signal used, the CAL ENABLE signal may be configured for limiting the CLK signal to a predetermined number of clock cycles (e.g., P cycles) during each calibration phase. For example, the CAL ENABLE signal may be derived from a state machine, table or other control logic (not shown), which has been configured for asserting the CAL ENABLE signal for a predetermined number of clock cycles and de-asserting the CAL ENABLE signal thereafter. As shown in FIG. 4, the CAL ENABLE and CLK signals are each supplied to a logic gate (e.g., an AND gate). When the CAL ENABLE signal is asserted, calibrate enable block 230 is used for clocking the digital control block 220 once for every cycle of the CLK signal. After the predetermined number of cycles has passed, the CAL ENABLE signal is de-asserted for disabling the digital control block and returning the PLL to a normal operation mode.

The predetermined number of clock cycles may be based on a number of clock cycles needed for calibrating the oscillator and compensating for real-time variations in PVT. In other words, the predetermined number of clock cycles may equal to a known number of cycles needed to shift the center frequency of the oscillator to the appropriate target range. In some cases, the number of cycles needed for calibrating the oscillator may be based on simulation results obtained over various process, voltage and temperature corners. The simulations may be performed by a user, or alternatively, by a manufacturer of the PLL device before the product is shipped to the user.

Preferred embodiments of calibration circuit 200 will now be described in reference to FIGS. 4-8. As shown in FIG. 4, analog comparison block 210 may include a pair of frequency-to-voltage (F-to-V) converters 240 for converting the REF and FB clock signals into a corresponding pair of voltages ($V_{REF}$, $V_{FB}$), and an operational amplifier 250 for comparing the voltages generated by converters 240. The output ($V_{OUT}$) of operational amplifier ("op amp") 250 may then be supplied to digital control block 220 for controlling the polarity (+/−) of the calibration signal (X Cal. Bits) supplied to the VCO. For example, if the feedback voltage ($V_{FB}$) is too high (i.e., the feedback frequency is lower than the reference frequency), operational amplifier 250 may supply a logic high (e.g., a logic 1) output signal to digital control block 220, causing the digital control block to supply a positive number of calibration bits to the VCO. If the feedback voltage ($V_{FB}$) is too low (i.e., the feedback frequency is higher than the reference frequency), a logic low (e.g., a logic 0) output signal may be supplied to digital control block 220 for supplying a negative number of calibration bits to the VCO.

However, one skilled in the art would understand that the logic level of the op amp output may be reversed, depending on the particular manner in which the reference ($V_{REF}$) and feedback ($V_{FB}$) voltages are compared. For example, the reference and feedback voltages may be supplied to opposite input terminals of the op amp, so as to generate a logic high output signal (e.g., $V_{OUT}$=logic 1) when the FB clock leads the REF clock and a logic low output signal (e.g., $V_{OUT}$=logic 0) when the FB clock lags the REF clock. In other words, the designation of the $V_{OUT}$ logic level to clock frequency comparison is arbitrary and may be accounted for by the control logic used in the digital control block.

As noted above, calibrate enable block 230 may be used for clocking digital control block 220 once per CLK signal cycle when the CAL ENABLE signal is asserted (i.e., when the PLL is operating in the calibration mode). In one embodiment, calibrate enable block 230 may include an AND gate for receiving the CLK and CAL ENABLE signals, as shown in FIG. 4. However, one skilled in the art would understand how the calibrate enable block could be implemented with additional or alternative logic components, while maintaining the same functionality.

Once the CAL ENABLE signal is asserted, digital control block 220 receives the output signal ($V_{OUT}$) generated by op amp 250 in response to a first set of reference ($V_{REF}$) and feedback ($V_{FB}$) voltages generated during a first CLK cycle. In one embodiment, digital control block 220 may include an up/down counter (not shown) for generating an "up" or "down" control signal corresponding to the op amp output signal. For example, an "up" control signal may be generated when the FB clock frequency lags the REF clock frequency, while a "down" control signal is generated when the FB clock frequency leads the REF clock frequency. Additional control logic (not shown) may also be included for converting the up/down control signals into a positive/negative number of calibration bits. Once the up/down control signal is asserted, the positive/negative number of calibration bits may be supplied to the VCO for changing the capacitance of the switched capacitor bank and adjusting the center frequency (fc). Once the center frequency is changed, the calibration process may stop (as described below) or continue during a next CLK cycle. If the calibration process continues, a new feedback voltage (corresponding to the new VCO center frequency) may be compared with the reference voltage to generate a new set of calibration bits.

In most cases, the calibration process described above may continue until the calibration bits supplied to the VCO begin to toggle within the resolution of the system. For example, if the calibration signal supplied to the VCO comprises X=5 bits, the calibration process may continue until the calibration bits begin to toggle between X=+5 and X=−5 bits. At this time, the calibration process may be stopped and the final calibration bits (or an average thereof) may be supplied to the VCO during normal operation of the PLL. In some embodiments, the additional control logic included within digital control block 220 may include means for detecting when the calibration bits begin to toggle between incremental positive and negative amounts. In other embodiments, the CAL ENABLE signal may only allow the calibration process to continue for the duration of the predetermined number of CLK cycles (based on simulation results obtained over specific PVT corners). In some cases, the latter embodiment may be used to simplify the digital control logic when the number of cycles needed to calibrate the VCO for specific PVT corners is known beforehand.

Figure 5A:
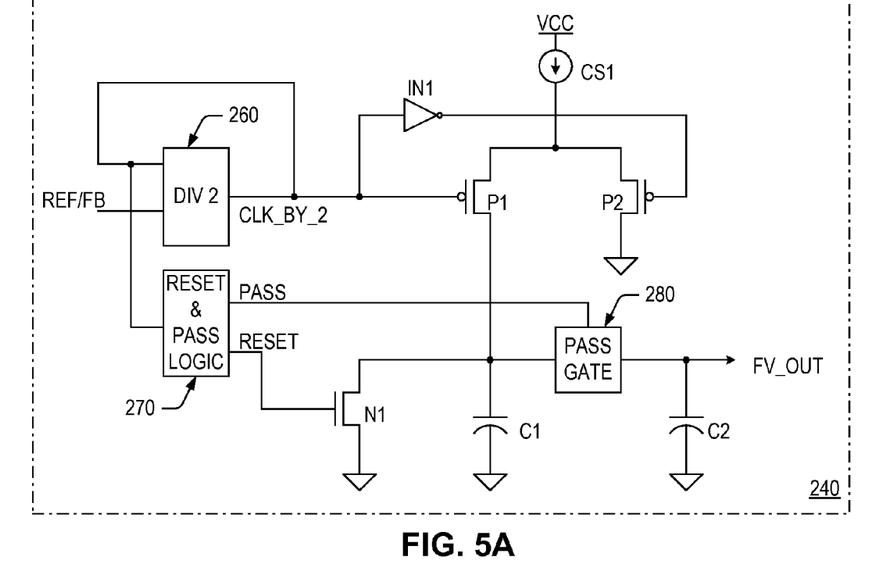
FIG. 5A is a simplified circuit diagram illustrating one embodiment of the frequency-to-voltage (F-to-V) conversion circuit used in the improved solution shown in FIG. 4.
Figure 5B:
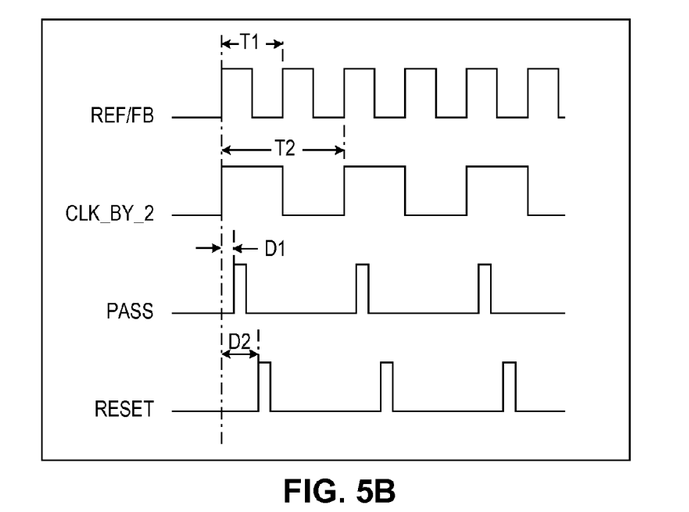
FIG. 5B is a timing diagram illustrating exemplary control signals generated by the F-to-V conversion circuit of FIG. 5A.
Figure 6:
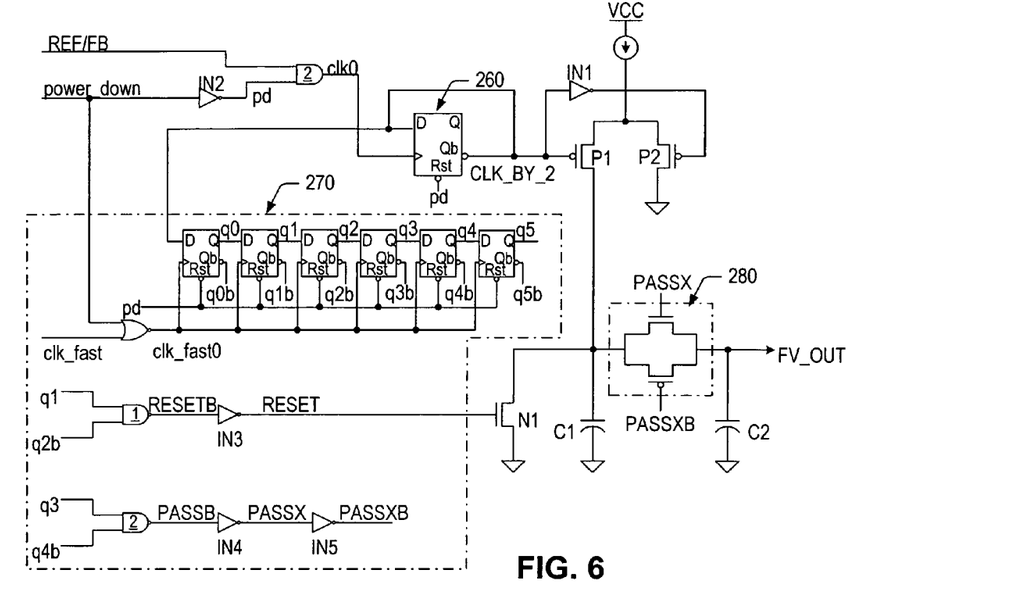
FIG. 6 is a detailed view of the frequency-to-voltage (F-to-V) conversion circuit shown in FIG. 5A, according to one embodiment of the invention.

Exemplary embodiments of F-to-V converters 240 are shown in FIGS. 5 and 6.

FIG. 5A is a simplified circuit diagram illustrating one embodiment of a frequency-to-voltage conversion circuit that may be used within calibration circuit 200 for converting the reference and feedback frequencies into corresponding voltages. As shown in FIG. 5A, the frequency-to-voltage conversion circuits may each include a "divide-by-two" counter 260, a reset and pass generator 270, a reset transistor (N1) and a differential stage. In one embodiment of the invention, the differential stage may be implemented with PMOS transistors P1/P2, inverter IN1, capacitors C1/C2 and pass gate 280, as shown in FIG. 5A.

In the embodiment shown, "divide-by-two" counter 260 is coupled for receiving the reference (or feedback) clock signal and configured for creating a 50% duty cycle signal (CLK_BY_2) in response thereto. In other words, counter 260 may generate a CLK_BY_2 pulse train, whose period (T2) is twice as long as the period (T1) of the reference (or feedback) clock signal (see, FIG. 5B). As shown in FIG. 5A, the CLK_BY_2 signal may be supplied to the differential stage for alternately charging and discharging capacitor C1. For example, capacitor C1 may be discharged to ground during a first half of the CLK_BY_2 cycle by supplying a logic high pulse to transistor P1 and a logic low pulse to transistor P2 (via inverter IN1). During a second half of the CLK_BY_2 cycle, capacitor C1 may be charged (via current source CS1 and transistor P1) by supplying the opposite logic levels to transistors P1 and P2.

Reset and pass generator 270 is coupled for receiving the CLK_BY_2 signal and configured for creating two skinny pulses (denoted PASS and RESET) in response thereto. Once capacitor C1 is sufficiently charged, the skinny PASS signal is generated for transferring the voltage developed across capacitor C1 to the second capacitor (C2) that is connected to the output (FV_OUT). In other words, after a short amount of delay (D1), a logic high PASS signal may be supplied to pass gate 280 for transferring the voltage from capacitor C1 to capacitor C2. The voltage transfer is complete when the PASS signal transitions from high to low. The voltages across capacitors C1 and C2 are maintained until capacitor C1 is again discharged to ground on the following RESET pulse, which is generated by the logic after another short delay (D2). The process of charging/discharging the capacitors and transferring the voltage may then be repeated on the next cycle of the 50% duty cycle (CLK_BY_2) signal.

FIG. 6 is a detailed view of frequency-to-voltage conversion circuit 240 in accordance with one embodiment of the invention. More specifically, FIG. 6 illustrates one manner in which the logic signals (i.e., CLK_BY_2, PASS and RESET) may be generated, along with one possible implementation for creating this logic. For example, "divide-by-two" counter 260 may be implemented with a D-type flip flop for creating the 50% duty cycle signal. As shown in FIG. 6, the "divide-by-two" flip flop may be clocked with the reference (or feedback) clock signal and may be reset with a "power_down" signal. The "power_down" signal may be supplied from an upstream control block (not shown) for powering down the F-to-V circuit when not in use (e.g., when the PLL is operating in a normal operation mode).

As shown in FIG. 6, reset and pass generator 270 may be implemented with a series of D-type flip flops and additional control logic. In the particular embodiment shown, reset and pass generator 270 includes six D-type flip flops, which are connected in series for generating a plurality of progressively delayed complementary signals (denoted q1-q5 and q1b-q5b). In some cases, a clocking signal frequency similar to the reference and/or feedback clock frequencies may be used for clocking the series flops. In other cases, a substantially faster clock (denoted "clk_fast" in FIG. 6) may be used for clocking the series flops. The faster clock may be obtained from an external source (e.g., a crystal oscillator) or from any other source capable of providing a faster clock signal (e.g., at least 4 times faster) than the reference and feedback clocks. In some cases, a faster clock signal may be used to provide smaller delay intervals for D1 and D2.

With each flip flop, the CLK_BY_2 signal is shifted in time/phase to produce the progressively delayed "q" and "qb" output signals. This phase relationship may then be used for generating the PASS and RESET signals that trigger the voltage transfer and capacitor reset functions described above in reference to FIG. 5A. As shown in FIG. 6, for example, output signals q1 and q2b are supplied to NAND gate 1 for generating a complementary reset signal (RESETB), which is then inverted by inverter IN3 for supplying the reset signal (RESET) to the gate of transistor N1. In this manner, output signals q1 and q2b, NAND gate 1 and inverter IN3 may be used for generating the RESET signal after a predetermined amount of delay (D2). In addition, output signals q3 and q4b are supplied to NAND gate 2 for generating a complementary pass signal (PASSB), which is then inverted by inverters IN4 and IN5 for supplying a pair of pass signals (PASSX and PASSXB) to the gate terminals of pass gate transistors 280. In this manner, output signals q3 and q4b, NAND gate 2, inverter IN4 and inverter IN5 may be used for generating the PASS signals after another predetermined amount of delay (D1). In some cases, a greater or lesser amount of delay may be imparted to the PASS and RESET signals by including a greater or lesser amount of delay elements within logic 270. Regardless, the amount of delay imparted to the PASS and RESET signals should provide sufficient time for charging and discharging capacitors C1 and C2.

The calibration circuit 200 shown in FIGS. 3-6 improves upon conventional techniques by using analog circuitry (i.e., analog comparison block 210) for comparing the reference and feedback voltages, and by using digital circuitry (i.e., digital control block 220) for adjusting the polarity of the calibration bits based on such comparison.

The analog and digital circuitry used in calibration circuit 200 is significantly faster (e.g., up to 16 times faster) than the digital frequency counters and state machine used in the fourth conventional solution described above. For example, the conventional solution may require up to 650 clock cycles, whereas the present solution may consume only 20-40 clock cycles (or less) to calibrate the VCO. In addition, the present solution provides a means for entering the calibration mode (e.g., by supplying the CAL ENABLE signal to various PLL components) without disconnecting the VCO from other PLL components. This enables the present solution to avoid the use of series switches within the PLL signal path, thereby avoiding the possibility of altering the filter behavior by introducing a series resistance. Other advantages/improvements may be apparent in light of the description provided below.

Figures 7A, 7B:
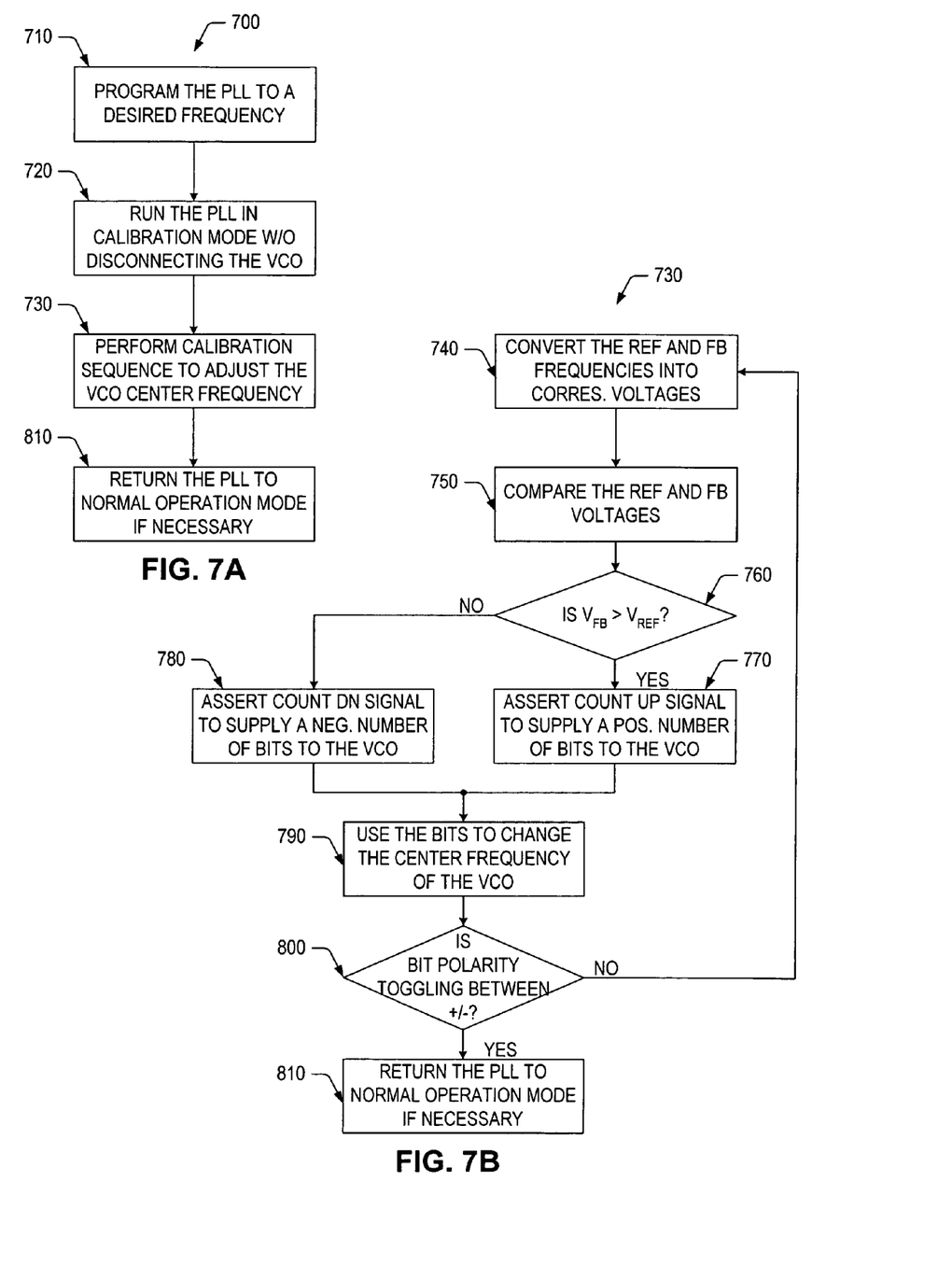
FIG. 7A is a flow chart diagram illustrating an improved method for extending the usable frequency range of a PLL device.
FIG. 7B is a flow chart diagram illustrating an improved method for calibrating an LC-type VCO during operation of a PLL device.

FIGS. 7A and 7B illustrate one embodiment of an improved method for extending the usable frequency range of a PLL device. More specifically, method 700 illustrates one manner in which an LC-type VCO may be calibrated during operation of a PLL device to compensate for variations in process, voltage and temperature. In some cases, the method may begin (in step 710) by programming the PLL to a desired frequency or channel (for example, 2 Mhz*800=1.6 Ghz or 2 Mhz*810=1.62 Ghz, etc. . . . ). As shown in FIG. 1, for example, the PLL may be programmed by supplying an external clocking signal ($F_{REF}$) to PFD 130 and then programming dividers 120 and/or 170 to the desired reference clock frequency. Next, the method may include running the PLL circuitry in a calibration mode, and tying the VCO control line to a desired control voltage (step 720). For example, a CAL ENABLE signal may be supplied to one or more PLL components (e.g., PFD 130, filter 150 and/or VCO 160) to cause the PLL circuitry to enter the calibration mode. This is desirable because it enables the PLL to enter the calibration mode without disconnecting the VCO from other PLL components.

In some cases, the PLL may be run in calibration mode each and every time the PLL circuitry is powered-up. In other cases, the calibration mode may only be entered at certain times (e.g., predefined or user-defined times). Regardless, the improved method described herein enables the calibration mode to be entered and VCO calibration to be performed during operation of the PLL device. In doing so, the method described herein improves upon conventional solutions, which may only calibrate the VCO during the manufacturing test phase, by compensating for the actual environmental conditions in which the PLL is run (i.e., process, voltage and temperature conditions).

In some embodiments, the calibration mode may be run in parallel with a normal operation mode of the PLL. For example, the VCO calibration sequence described below may be performed as the VCO attempts to achieve phase-lock between the reference and feedback clock signals. In other embodiments, the VCO calibration operation may be run prior to the normal PLL operation (i.e., in series with the normal operation mode). In some cases, the latter embodiment may be preferred, so that normal operation of the VCO does not affect or delay the calibration process.

Once the PLL enters the calibration mode, a calibration sequence may be performed to adjust the center frequency (fc) of the VCO, if such adjustment is necessary or desired. One embodiment of the calibration sequence is shown in FIG. 7B as method 730. In some cases, method 730 may begin (in step 740) by converting the reference (REF) and feedback (FB) clock frequencies into corresponding voltages (e.g., using frequency to voltage module 240, as described above). Once converted, the voltages may be compared (via indirect frequency comparison) in step 750. If the feedback voltage ($V_{FB}$) is too high (i.e., the FB frequency is too low) in step 760, a "count up" signal is asserted (e.g., via an up/down counter) to increase the VCO center frequency by supplying a positive number of calibration bits to the VCO (in step 770). If the feedback voltage is too low (i.e., the FB frequency is too high) in step 760, a "count down" signal is asserted (e.g., via the up/down counter) to decrease the VCO center frequency by supplying a negative number of calibration bits to the VCO (in step 780).

Once the up/down counter is clocked, the VCO center frequency is changed using the calibration bits (in step 790). In some cases, the up/down counter may be clocked at a fixed rate. In other cases, the first Y (e.g., 10) number of cycles may be sampled at a higher clock rate to decrease the overall calibration time.

Once the VCO center frequency is changed, the method determines whether the calibration process should stop or continue. In the embodiment of FIG. 7B, for example, the method may determine whether or not the polarity of the calibration bits have begun to toggle between positive and negative values (in step 800). If toggling occurs, the method may return the PLL to a normal operation mode (in step 810), if necessary (e.g., if the calibration and normal operation modes are run in series). If toggling does not occur, the method may continue (in step 740) by comparing the new VCO center frequency to the reference frequency. The process may then continue (i.e., steps 740-800 may be repeated) until the calibration bits begin to toggle within the resolution of the system (e.g., between +X and −X bits).

Once calibration is achieved, a final calibration bit value (or an average of the final minimum and maximum bit values) may be used to calibrate the VCO and the calibration circuitry is turned off. The PLL circuitry may then be activated in normal operation mode (if not done previously) using the calibration bit value obtained from the VCO calibration process.

In addition to the advantages described above, the improved circuit and method allows a high-performance, narrow frequency range VCO (e.g., an LC-type oscillator) to be used in wide frequency applications by calibrating the VCO during operation of the PLL device to compensate for actual variation in PVT. As noted above, the improved circuit and method provides a means for obtaining fast frequency lock by utilizing analog, instead of digital, comparison circuitry in the VCO calibration circuitry. In some cases, the improved circuit and method may provide frequency lock up to 16 times faster than conventional solutions. In some embodiments, the frequency lock speed provided herein may be increased or decreased by adjusting the number of calibration bits supplied to the VCO.

Figure 8:
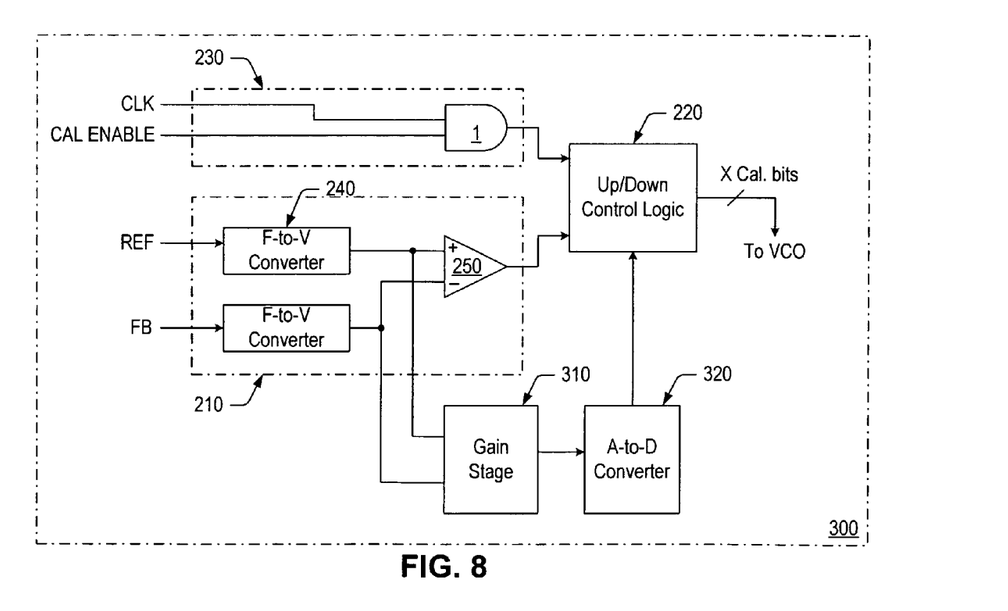
FIG. 8 is a block diagram illustrating an alternate embodiment of the improved PLL calibration solution in accordance with the present invention.

FIG. 8 is block diagram illustrating one manner in which the number of calibration bits may be adjusted, in accordance with one alternate embodiment of the invention. Like previous embodiments, calibration circuitry 300 may include analog comparison block 210, digital control logic block 220 and calibrate enable block 230. As shown in FIG. 8, calibration circuitry 300 may include additional logic for comparing the reference ($V_{REF}$) and feedback ($V_{FB}$) voltages generated by frequency-to-voltage converters 240. The difference between these voltages may then be used to increase or decrease the number of calibration bits supplied to the VCO. For example, if a large voltage difference exists, the number of calibration bits may be decreased to speed up the calibration process. On the other hand, the number of calibration bits may be increased if a small voltage difference exists to enhance the resolution of the system. In some cases, the number of calibration bits may be adjusted during each cycle of the sampling clock (CLK) signal (i.e., prior to each assertion of the up/down counter). In other cases, the number of calibration bits may be adjusted only after the first cycle of the sampling clock. In yet other cases, the number of calibration bits may be periodically adjusted after every K cycles of the sampling clock.

In one embodiment, calibration circuitry 300 may include gain stage 310 for detecting the difference between the reference ($V_{REF}$) and feedback ($V_{FB}$) voltages. Analog to digital converter 320 may then be used for converting the voltage difference into a digital value. When supplied to digital control logic block 230, the digital difference value may be used to increase/decrease the number of calibration bits supplied to the VCO. It is noted, however, that the number of calibration bits may be adjusted by alternative means in other embodiments of the invention.

In addition to the embodiments described above, the inventive concepts may be modified or adjusted to produce various alternative embodiments of the invention. A few of the alternative embodiments contemplated herein are provided below. Other embodiments and modifications are possible and within the scope of the invention.

As noted above, a sampling clock (CLK) frequency similar to the reference and/or feedback clock frequencies may be used for clocking the calibration circuitry. In an alternative embodiment, a higher sampling clock (CLK) can be used to reduce lock time. For example, a user may choose a higher clock rate or a different counter to speed up the calibration process and reduce the overall phase-lock time for the PLL.

As noted above, the user may sometimes choose to run the VCO calibration before (i.e., in series with) the normal PLL operation. In an alternate embodiment, the user may choose to run the VCO calibration in sync (i.e., in parallel) with the normal PLL operation to increase overall lock speed (i.e., reduce overall lock time).

As noted above, the end results of the calibration process (i.e., the last calibration bit value) may be supplied to the VCO for calibration purposes. In an alternative embodiment, the calibration process may average the results obtained from the up/down counter over Z-number of cycles for smaller calibration error.

As noted above, the calibration process may compare two similar frequencies (i.e., similar REF and FB frequencies) to calibrate the VCO. In an alternative embodiment, the calibration process can compare two different frequencies by scaling one of the REF and FB frequencies (e.g., by supplying the VCO output directly to F-to-V converter 240) and altering the frequency to voltage module (e.g., with an internal capacitor or current source to compensate for the frequency difference).

Embodiments of the present invention are well suited to performing various other steps or variations of the steps recited herein, and in a sequence other than that depicted and/or described herein. In one embodiment, such a process is carried out by processors and other electrical and electronic components, e.g., executing computer readable and computer executable instructions comprising code contained in a computer usable medium.

For purposes of clarity, many details of invention that are widely known and are not relevant to the present invention have been omitted from the following description.

It should be appreciated that reference throughout this specification to "one embodiment" or "an embodiment" means that a particular feature, structure or characteristic described in connection with the embodiment is included in at least one embodiment of the present invention. Therefore, it is emphasized and should be appreciated that two or more references to "an embodiment" or "one embodiment" or "an alternative embodiment" in various portions of this specification are not necessarily all referring to the same embodiment. Furthermore, the particular features, structures or characteristics may be combined as suitable in one or more embodiments of the invention.

Similarly, it should be appreciated that in the foregoing description of exemplary embodiments of the invention, various features of the invention are sometimes grouped together in a single embodiment, figure, or description thereof for the purpose of streamlining the disclosure to aid in the understanding of one or more of the various inventive aspects. This method of disclosure, however, is not to be interpreted as reflecting an intention that the claimed invention requires more features than are expressly recited in each claim. Rather, as the following claims reflect, inventive aspects may lie in less than all features of a single foregoing disclosed embodiment. Thus, the claims following the detailed description are hereby expressly incorporated into this detailed description, with each claim standing on its own as a separate embodiment of this invention.

What is claimed is:

1. A circuit configured for calibrating an oscillator included with a phase locked loop (PLL) device, the circuit comprising:
    a calibrate enable signal supplied to the PLL device, wherein the calibrate enable signal causes the PLL device to enter a calibration mode without disconnecting the oscillator from a control voltage generated by other PLL device components;
    an analog comparison block coupled for receiving a reference clock signal and a feedback clock signal from the PLL device when operating in the calibration mode, wherein the analog comparison block is configured for using the reference and feedback clock signals to determine whether an operating frequency of the oscillator should be increased or decreased;
    a digital control block coupled for supplying a calibration signal to the oscillator based on the determination made by the analog comparison block; and
    a calibrate enable control block coupled for receiving the calibrate enable signal and a clocking signal having a preset number of cycles, wherein the calibrate enable control block is configured for clocking the digital control block once for every cycle of the clocking signal and for disabling the digital control block after the preset number of cycles is complete.

2. The circuit as recited in claim 1, wherein the analog comparison block comprises:
    a pair of frequency-to-voltage converters coupled for converting the reference and feedback clock signals into a pair of voltages; and
    an operational amplifier coupled for comparing the pair of voltages to determine whether the operating frequency of the oscillator should be increased or decreased.

3. The circuit as recited in claim 1, wherein the digital control block comprises an up/down counter and the calibration signal comprises a number of calibration bits configured for increasing or decreasing the operating frequency of the oscillator by a programmable amount.

4. The circuit as recited in claim 3, wherein the oscillator comprises an LC-type voltage controlled oscillator.

5. The circuit as recited in claim 4, wherein the calibration signal is configured for increasing or decreasing the operating frequency of the oscillator by connecting or disconnecting one or more capacitors included within a switched capacitor bank of the LC-type voltage controlled oscillator.

6. The circuit as recited in claim 1, wherein the clocking signal is derived from one of the following clocking signals: the reference clock signal, the feedback clock signal and a user defined clock signal having a higher or lower frequency than the reference and feedback clock signals.

7. The circuit as recited in claim 1, wherein the preset number of cycles is based on a simulated number of cycles needed for calibrating the oscillator within a target frequency range.

8. The circuit as recited in claim 2, further comprising an adjustment control block coupled for detecting a voltage difference between the pair of voltages and for using the voltage difference to select an appropriate number of calibration bits to use per cycle of the clocking signal.

9. A method for extending a usable frequency range of a phase locked loop (PLL) device, the method comprising:
  programming an oscillator of the PLL device to a desired operating frequency;
  running the PLL device in a calibration mode without disconnecting the oscillator from a control voltage generated by other PLL device components;
  extending the usable frequency range of the PLL device by adjusting the operating frequency of the oscillator in the calibration mode to account for variations in process, voltage and temperature conditions occurring during operation of the PLL device; and returning the PLL device to a normal operation mode once the adjustments made to the operating frequency begin to toggle between incremental positive and negative amounts,
  wherein the adjusting the operating frequency comprises:
    receiving reference and feedback clock signals from the PLL device;
    converting the reference and feedback clock signals into a corresponding pair of voltages; and
    comparing the pair of voltages against one another to determine whether the operating frequency of the oscillator should be adjusted by an incremental positive or negative amount.

10. The method as recited in claim 9, wherein said running the PLL device in a calibration mode comprises supplying a calibrate enable signal to one or more PLL device components to tri-state a phase frequency detecting (PFD) of the PLL device and force the oscillator in a voltage state corresponding to the desired operating frequency.

11. The method as recited in claim 9, further comprising running the PLL device in a normal operation mode in parallel with the calibration mode.

12. The method as recited in claim 9, wherein said adjusting the operating frequency further comprises receiving a sampling clock and incrementally adjusting the operating frequency of the oscillator once per cycle of the sampling clock.

13. The method as recited in claim 9, wherein the sampling clock comprises either the reference clock signal or the feedback clock signal.

14. The method as recited in claim 12, wherein the sampling clock comprises a user defined clock signal with a relatively higher frequency than the reference and feedback clock signals, as to reduce an amount of time for calibrating the oscillator and achieving PLL device phase-lock.

15. The method as recited in claim 12, wherein said adjusting the operating frequency further comprises detecting a difference between the pair of voltages and using the voltage difference to select an appropriate number of calibration bits to use for incrementally adjusting the operating frequency of the oscillator during each cycle of the sampling clock.

16. A phase locked loop (PLL) device comprising:
  a phase frequency detector (PFD) coupled for receiving a reference clock signal from an external source and a feedback clock signal from a voltage controlled oscillator (VCO) of the PLL device; and
  a calibration block coupled to the PFD and VCO for:
    receiving a clocking signal having a preset number of cycles;
    receiving a calibrate enable signal, which is forwarded to the PFD and the VCO for tri-stating the PFD and entering a calibration mode;
    receiving the reference and feedback clock signals during the calibration mode;
    converting the reference and feedback clock signals into a pair of voltages;
    comparing the pair of voltages to determine whether an operating frequency of the VCO should be increased or decreased; and
    supplying, via a control block, a calibration signal to adjust the operating frequency of the VCO based on said comparison, wherein the control block is clocked once for each cycle of the preset number of cycles and then disabled.

* * * * *